(12) United States Patent
Nadeau

(10) Patent No.: US 11,469,486 B2
(45) Date of Patent: Oct. 11, 2022

(54) SURFACE MOUNT RADIO FREQUENCY CROSSOVER DEVICE

(71) Applicant: Knowles Cazenovia, Inc., Cazenovia, NY (US)

(72) Inventor: Pierre Nadeau, Fayetteville, NY (US)

(73) Assignee: KNOWLES CAZENOVIA, INC., Cazenovia, NY (US)

( * ) Notice: Subject to any disclaimer, the term of this patent is extended or adjusted under 35 U.S.C. 154(b) by 0 days.

(21) Appl. No.: 16/699,187

(22) Filed: Nov. 29, 2019

(65) Prior Publication Data

US 2021/0167478 A1 Jun. 3, 2021

(51) Int. Cl.
| | | |
|---|---|---|
| *H01P 5/02* | (2006.01) | |
| *H01P 3/08* | (2006.01) | |
| *H05K 1/02* | (2006.01) | |
| *H05K 1/18* | (2006.01) | |

(52) U.S. Cl.
CPC ............... *H01P 5/02* (2013.01); *H01P 3/081* (2013.01); *H05K 1/025* (2013.01); *H05K 1/0242* (2013.01); *H05K 1/181* (2013.01); *H05K 2201/10363* (2013.01)

(58) Field of Classification Search
CPC ......... H01P 3/081; H01P 5/02; H05K 1/0242; H05K 1/025; H05K 1/181
See application file for complete search history.

(56) References Cited

U.S. PATENT DOCUMENTS

| | | | |
|---|---|---|---|
| 5,321,375 A | 6/1994 | Corman | |
| 6,734,750 B1 | 5/2004 | Ostergaard | |
| 6,949,819 B2 * | 9/2005 | Saito | H01R 31/08 257/692 |
| 2003/0206083 A1 * | 11/2003 | Takahashi | H01P 1/20363 333/247 |
| 2004/0256716 A1 | 12/2004 | Saito et al. | |
| 2008/0018391 A1 | 1/2008 | Bates | |
| 2008/0211601 A1 | 9/2008 | Bates | |

(Continued)

FOREIGN PATENT DOCUMENTS

| | | |
|---|---|---|
| CN | 1184342 A | 6/1998 |
| CN | 1430462 A | 7/2003 |
| DE | 10 2015 115 819 A1 | 3/2017 |

OTHER PUBLICATIONS

U.S. Appl. No. 17/013,504, filed Sep. 4, 2020, Burdick.
First Office Action for CN Appl. No. 202011362554.8, dated Jul. 1, 2022.

*Primary Examiner* — Samuel S Outten
(74) *Attorney, Agent, or Firm* — Foley & Lardner LLP

(57) ABSTRACT

A microwave or radio frequency (RF) device includes an insulating substrate having a first surface and a second surface opposing the first surface. The device also includes a crossover conductor disposed on the first surface extending between a first edge of the first surface and a second edge of the first surface. The device also includes a depression in the second surface defined at least in part by (i) a third surface recessed in relation to the second surface, and (ii) at least one sidewall that extends between the second surface and the third surface. The device further includes a conductive coating formed over at least a portion of the second surface, the third surface, and the at least one sidewall, where the conductive coating is insulated from the crossover conductor by the insulating substrate.

19 Claims, 5 Drawing Sheets

(56) References Cited

U.S. PATENT DOCUMENTS

| | | |
|---|---|---|
| 2009/0231064 A1 | 9/2009 | Bates et al. |
| 2013/0342287 A1 | 12/2013 | Randall et al. |
| 2014/0264287 A1* | 9/2014 | Abraham ................ H01P 7/086 257/31 |
| 2014/0306776 A1 | 10/2014 | Eom et al. |
| 2016/0049713 A1* | 2/2016 | Ostergaard .......... H01P 1/20345 333/238 |
| 2018/0183130 A1 | 6/2018 | Bates |
| 2019/0081378 A1 | 3/2019 | Bates |
| 2020/0021030 A1 | 1/2020 | Bates |
| 2020/0259263 A1 | 8/2020 | Dani |
| 2020/0358160 A1 | 11/2020 | Alton |
| 2020/0403286 A1 | 12/2020 | Burdick |

* cited by examiner

SURFACE MOUNT RADIO FREQUENCY CROSSOVER DEVICE

BACKGROUND

Microwave and radio-frequency (RF) circuits can incorporate the routing of transmission lines that interconnect RF components such as amplifiers, mixers and filters that are integrated on a substrate such as a printed circuit board. In some instances, transmission line paths on printed circuit boards may intersect, resulting in a need for crossover components.

SUMMARY

In an embodiment, a RF crossover device includes an insulating substrate having a first surface and a second surface opposing the first surface. The crossover device further includes a crossover conductor disposed on the first surface extending between a first edge of the first surface and a second edge of the first surface. The crossover device also includes a depression in the second surface defined at least in part by (i) a third surface recessed in relation to the second surface, and (ii) at least one sidewall that extends between the second surface and the third surface. The crossover device further includes a conductive coating formed over at least a portion of the second surface, the third surface, and the at least one sidewall, the conductive coating being insulated from the crossover conductor by the insulating substrate.

In some embodiments, the depression extends between two side surfaces of the insulating substrate. In some embodiments, the depression extends in a direction that is orthogonal to a direction in which the crossover conductor extends on the first surface. In some embodiments, the crossover device further includes a first transition conductor, conductively coupled with the crossover conductor, disposed on a first side surface of the insulating substrate, and a second transition conductor, conductively coupled with the crossover conductor, disposed on a second side surface of the insulating substrate.

In some embodiments, the first transition conductor extends between the first edge of the first surface and a first edge of the second surface, and wherein the second transition conductor extends between the second edge of the first surface and a second edge of the second surface. In some embodiments, the first side surface of the insulating substrate includes a first indented region, and wherein the first transition conductor is at least partially disposed over the first indented region. In some embodiments, the crossover device further includes a first crossover contact disposed on the second surface of the insulating substrate and coupled with the first transition conductor, a second crossover contact disposed on the second surface of the insulating substrate and coupled with the second transition conductor. In some embodiments, the first crossover contact is separated from the conductive coating on the second surface by a first crossover isolation region, and wherein the second crossover contact is separated from the conductive coating on the second surface by a second crossover isolation region.

In some embodiments, at least a portion of the crossover conductor includes a transmission line. In some embodiments, the crossover conductor includes at least one impedance matching structure positioned between the transmission line and at least one of the first edge and the second edge of the first surface. In some embodiments, the crossover conductor includes a plurality of metallic layers, wherein materials of at least two metallic layers of the plurality of metallic layers are different. In some embodiments, the plurality of metallic layers include metallic layers of at least two of copper, silver, gold, nickel, or titanium-tungsten alloy. In some embodiments, the conductive coating includes a plurality of metallic layers, wherein materials of at least two metallic layers of the plurality of metallic layers are different. In some embodiments, the insulating substrate includes at least one of a ceramic material, glass, sapphire, quartz or a printed circuit board material.

In some embodiments, a RF device includes a circuit board having a first surface and an opposing second surface. The RF device further includes a first RF conductor disposed on the first surface of the circuit board, the first RF conductor extending in a first direction. The RF device further includes a second RF conductor disposed on the first surface of the circuit board, the second RF conductor extending in a second direction, different from the first direction. The RF device also includes a ground conductor disposed on the first surface of the circuit board, the ground conductor electrically isolated from the first RF conductor and the second RF conductor. The RF device further includes the RF crossover device positioned on the circuit board. The conductive coating over the second surface of the insulating substrate makes contact with the ground plane. The first RF conductor passes under the depression in the second surface of the insulating substrate, and the second RF conductor is electrically coupled with the crossover conductor disposed on the first surface of the insulating substrate.

In some embodiments, the conductive coating on at least one sidewall is separated from the first RF conductor by a distance of between 15 mils and 25 mils. In some embodiments, the conductive coating on the third surface of the insulating substrate is separated from the first RF conductor disposed on the first surface of the circuit board by a distance of between 5 mils and 15 mils. In some embodiments, a magnitude of isolation between the first RF conductor and the crossover conductor is an increasing function of a width of the crossover conductor measured over the depression. In some embodiments, the crossover conductor is a first crossover conductor, and the RF device further includes a second crossover conductor disposed adjacent to the first crossover conductor over the first surface of the insulating substrate, where the second crossover conductor extends between the first edge and the second edge of the first surface.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1A:
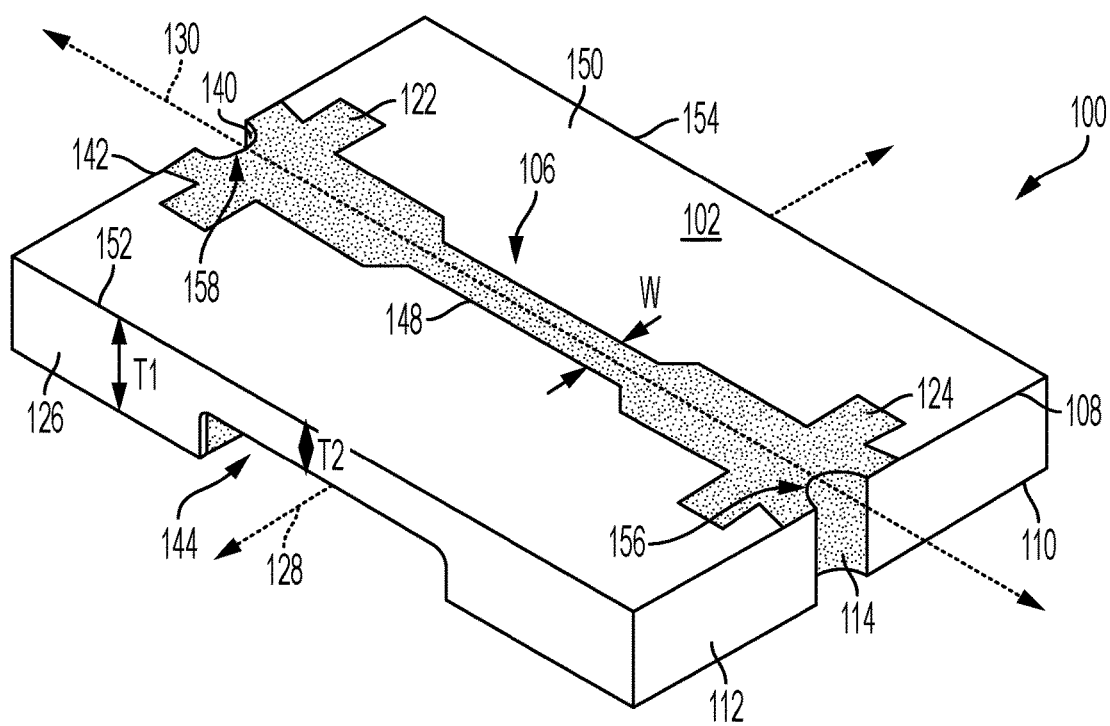
FIGS. 1A and 1B show isometric views of an example RF crossover device according to embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for crossover components used in microwave or RF devices (collectively referred to herein as "RF devices"). The RF devices can include components such as conductors, transmission lines, filters, etc., that are formed on a substrate such as a printed circuit board. In some instances, paths of two or more RF transmission lines may intersect, resulting in a need for a crossover to allow one RF transmission line to cross the path of the other RF transmission line without making contact with the other RF transmission line. One approach to forming a crossover is to use multi-layered printed circuit boards, where the RF transmission lines are crossed over using multiple conductive and/or ground layers in the PCB. For example, the PCB can include multilayer stripline layers that can be connected through vias to provide crossover of RF transmission lines. However, such approaches suffer from a need to have multiple PCB layers, which drives the cost and manufacturing complexity of the overall PCB. Multilayer PCB's also suffer from poorer manufacturing tolerances, which make millimeter-wave operation unrealizable.

One solution, discussed in relation to the embodiments disclosed herein, provides a crossover device that includes a ceramic or other insulating substrate that forms a jumper over the (microstrip) RF transmission line that is to be crossed over. In particular, the crossover device includes a metallized tunnel, which can be positioned over the crossed over RF transmission line in order to provide the necessary isolation between the two traces. The crossover device can include at least one conductor over at least one surface of the crossover device isolated from the metallization on the tunnel to provide a conductive path for the crossing RF transmission line. The ceramic substrate can be a monolithic structure or block (e.g., of a single material) and can provide improved isolation between the crossed over and the crossing RF transmission lines. For example, the improved isolation can allow the RF components, or the circuits in which the RF components are incorporated, to operate at frequencies as high as 40 GHz.

Figure 1B:
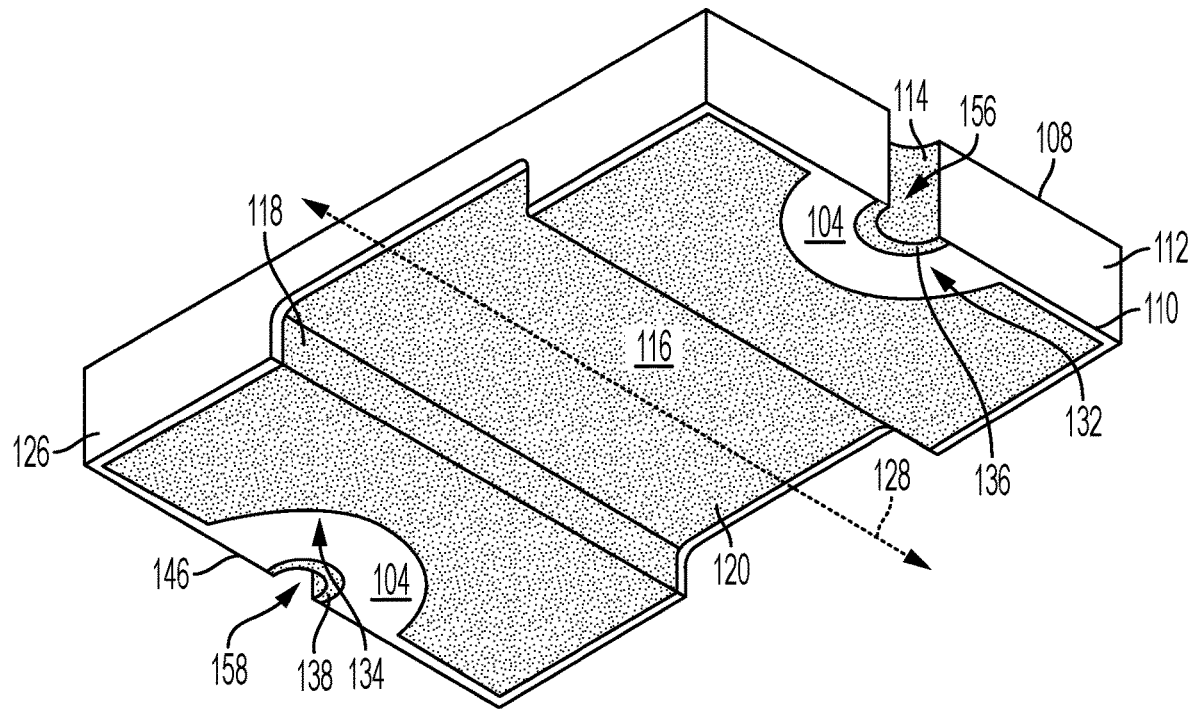

FIGS. 1A and 1B show isometric views of an example RF crossover device 100. The RF crossover device 100 includes an insulating substrate 150 having a first surface 102 and a second surface 104 opposing the first surface 102. A plurality of side surfaces, of which a first side surface 112 and a third side surface 126 are shown in FIGS. 1A and 1B, can extend between the first surface 102 and the second surface 104. In plan view, the first surface 102 and the second surface 104 have a rectangular shape. However, the first surface 102 or the second surface 104 can have shapes other than the rectangular shape shown in FIGS. 1A and 1B. In particular, the first surface 102 or the second surface 104 can have any polygonal shape (regular or irregular) or a circular or other shape. The shape of the first surface 102 and the second surface 104 in plan view may be different in some instances. The number of the plurality of side surfaces that extend between the first surface 102 and the second surface 104 can be a function of the shapes of the first surface 102 and the second surface 104. The first surface 102 is planar, however, in some embodiments, the first surface 102 can be non-planar, and can include depression(s) or protrusion(s). The first surface 102 has a perimeter including a first edge 108, a second edge 142, a third edge 152, and a fourth edge 154. The first side surface 112 extends between the first edge 108 of the first surface and the second surface 104, and the third side surface 126 extends between the third edge 152 of the first surface 102 and the second surface 104. While not shown in FIGS. 1A and 1B, a fourth side surface extends between the fourth edge 154 and the second surface 104.

The second surface 104 includes a depression 144. The depression 144 is defined at least in part by a third surface 116 that is recessed in relation to the second surface 104, a first depression sidewall 118 and/or a second depression sidewall (not shown) opposite the first depression sidewall 118. In some embodiments, the depression 144 comprises one or more arches that is/are defined at least in part by a one or more curved surfaces that that is/are recessed in relation to the second surface 104. The first depression sidewall 118 and the second depression sidewall can extend between the second surface 104 and the recessed third surface 116. As discussed further below, the depression 144 allows for a crossed over RF transmission line to pass below the RF crossover device 100 when the RF crossover device 100 is positioned over a printed circuit board. The third surface 116 is planar. However, in some instances, the third surface 116 may be non-planar, such as, a curved or convex shaped. The third surface 116 extends between the third side surface 126 and the fourth side surface (not shown) opposite the third side surface. A portion of the fourth side surface extends between the fourth edge 154 of the first surface 102 and the second surface 104 and another portion of the fourth side surface extends between the fourth edge 154 and the third surface 116. The RF crossover device 100 has a first thickness T1 measured between the first surface 102 and the second surface 104, and a second thickness T2 measured between the first surface 102 and the third surface 116 of the depression 144. The second thickness T2 is less than the first thickness T1. The second thickness T2 can be uniform along a longitudinal axis 128 of the depression 144. In some embodiments, the thickness T2 can be non-uniform along the longitudinal axis 128. The first depression sidewall 118 and the second depression sidewall can extend normal to the second surface 104 and the third surface 116, however, in some instances, the first depression sidewall 118 and the second depression sidewall can form a non-perpendicular angle with the second surface 104 and/or the third surface 116.

A crossover conductor 106 is disposed on the first surface 102, and extends between the first edge 108 and the second edge 142 of the first surface 102. The crossover conductor 106 provides a conductive path for the crossing over RF transmission line (e.g., to carry a signal). A first transition conductor 114 is disposed on the first side surface 112, and extends between the first edge 108 of the first surface 102 and a first edge 110 of the second surface 104. The first transition conductor 114 makes electrical contact with the crossover conductor 106 at the first edge 108 of the first surface 102. A second transition conductor 140 is disposed on a second side surface of the RF crossover device 100. The second side surface extends between the second edge 142 of the first surface 102 and the second surface 104. The second transition conductor 140 makes electrical contact with the crossover conductor 106 at the second edge 142 of the first surface 102. As discussed below, the first transition conductor 114, the crossover conductor 106 and the second transition conductor 140 provide a conductive path for a crossing over conductor disposed on a printed circuit board over which the RF crossover device 100 is disposed.

A first transition conductor 114 is disposed over the first side surface 112 and is coupled with the crossover conductor 106. The first transition conductor 114 extends between the first edge 108 of the first surface 102 and a first edge 110 of the second surface 104. The first transition conductor 114 provides a conductive path between the crossover conductor 106 and a RF transmission line positioned on the printed circuit board. Similarly, a second transition conductor 140 is disposed over the second side surface of the insulating substrate 150, where the second side surface extends between the second edge 142 of the first surface 102 and a second edge 146 of the second surface 104. The second transition conductor 140 provides a conductive path between the crossover conductor 106 and a RF transmission line positioned on the printed circuit board. The RF transmission line on the printed circuit board can be a crossing over RF component, and the combination of the first transition conductor 114, the crossover conductor 106, and the second transition conductor 140 can provide a conductive path (e.g., to carry a signal) to cross over another RF transmission line on the printed circuit board over which the crossover device 100 is positioned.

The first side surface 112 and the second side surface, which extend between the second edge 142 of the first surface 102 and the second edge 146 of the second surface 104, can include a first indented region 156 and a second indented region 158, respectively. At least a portion of the first transition conductor 114 is disposed over the first indented region 156 (or surface region), and at least a portion of the second transition conductor 140 is disposed over the second indented region 158 (or surface region). The first indented region 156 and the second indented region 158 can be a concave indentation (or surface region) in the first side surface 112 and the second side surface, respectively, of the insulating substrate 150. In some embodiments, the first indented region 156 and the second indented region 158 can be a result of a manufacturing processing step (e.g., machining, milling, drilling) of the insulating substrate 150. In some instances, multiple insulating substrates can be fabricated from a single larger insulating substrate. Holes can be drilled in the larger substrate, after which a metallization step can be carried out that can deposit at least the crossover conductor 106 and metallize the interior of the drilled holes. Thereafter, individual pieces of the insulating substrate can be diced by cutting along diameters of the drilled and metallized holes, such as for example along the first edge 108 and the second edge 142 of the first surface 102, and along the third edge 152 and the fourth edge 154. The resulting separated insulating substrate 150 can now include the indented regions 156 and 158 with metallization that forms the first and second transition conductors 114 and 140. In some embodiments, the first side surface 112 and the second side surface may not include the indented regions 156 and 158, and may instead be planar with the first and second transition conductors 114 and 140 disposed on a portion of the planar first and second side surfaces, respectively.

The crossover conductor 106 includes at least one transmission line 148 and at least one impedance matching structure, such as, for example, a first impedance matching structure 124 and a second impedance matching structure 122. The impedance matching structure is positioned after the surface mount transition 114 to provide improved performance and negate the capacitive loading that is inherent from the transition via. The transmission line 148 can be structured to have a specific impedance value, such as, for example, 50 ohms. The first and the second impedance matching structures 124 and 122 can reduce the risk of return loss by matching the impedance of the first and second transition conductors 114 and 140, respectively, to the impedance of the crossover conductor 106. The specific structure of each of the first and the second impedance matching structure 124 and 122 shown in FIGS. 1A and 1B is only an example and non-limiting, and other structures can be employed to provide similar impedance matching functionality and/or to support operation at various frequencies.

The crossover conductor 106 is disposed on the first surface 102 of the insulating substrate 150 along a crossover conductor axis 130. The crossover conductor axis 130 is parallel to the longitudinal axis of the insulating substrate 150, for instance. However, the crossover conductor axis 130 can have any orientation. In particular, the crossover conductor axis 130 direction can be based on the positions of the first and second transition conductors 114 and 140, which, in turn, can be positioned on the respective side surfaces of the insulating substrate 150 to match the positions of the connection points to the crossing over RF transmission line on the printed circuit board. For example, the crossover conductor 106 (and the crossover conductor axis 130) can be oriented at an angle with respect to the edges or the longitudinal axis of the insulating substrate 150. The direction of the crossover conductor axis 130 is substantially (e.g., within 5%) orthogonal to the direction of the longitudinal axis 128 of the depression 144. However, in some instances, the angle between the crossover conductor axis 130 and the longitudinal axis 128 of the depression 144 can be non-orthogonal, such as when the depression is positioned obliquely in relation to the third and fourth side surfaces of the insulating substrate 150.

The second surface 104 of the insulating substrate 150 can include a first crossover contact 136 and a second crossover contact 138. The first crossover contact 136 is positioned along the first edge 110 of the second surface 104, while the second crossover contact 138 is positioned along the second edge 146 of the second surface 104. The first crossover contact 136 is conductively coupled with the first transition conductor 114 and the second crossover contact 138 is conductively coupled with the second transition conductor 140. The first crossover contact 136 is positioned along a portion of the first edge 110 of the second surface 104 that forms a periphery of the first indented region 156. The second crossover contact 138 is positioned along a portion of the second edge 146 of the second surface 104 that forms a periphery of the second indented region 158. The first crossover contact 136 and the second crossover contact 138 can make contact with two ends (or portions or contact points) of a crossing over RF transmission line when the insulating substrate 150 is positioned on a printed circuit board. In some embodiments, the first crossover contact 136 and the second crossover contact 138 can be positioned anywhere over the second surface 104 of the insulating substrate 150. Their positions can be dependent upon the positions of the contact points to the crossing over RF transmission line on the printed circuit board.

A conductive coating 120 (e.g., that provides electromagnetic shielding) is formed over at least a portion of the second surface 104, the third surface 116 and at least one of the first depression sidewall 118 and the second depression sidewall. The conductive coating 120 can be formed of one or more metals or metal alloys. In the example shown in FIGS. 1A and 1B, the entire depression 144, that is, the third surface 116, the first depression sidewall 118, and the second depression sidewall, is coated with the conductive coating 120. In some other embodiments, only a portion of the depression 144 may be coated with the conductive coating 120. For example, in some embodiments, the third surface 116 may be coated with the conductive coating 120, and one or both of the first or second depression sidewalls may not be coated with the conductive coating 120.

The conductive coating 120 provides a ground plane connection, and can be conductively coupled with the ground plane on the printed circuit board on which the crossover device 100 is mounted. The conductive coating 120 in the depression 144 provides shielding between the crossover conductor 106 and the crossed over conductor that passes through a tunnel formed by the depression 144 when the crossover device 100 is mounted on the printed circuit board. In some examples, the conductive coating 120 in the depression 144 can provide a 30 dB to 50 dB isolation between the crossover conductor 106 and the crossed over conductor on the printed circuit board.

In some examples, the conductive coating 120 can include coatings of one or multiple metals such as gold (Au), nickel (Ni), titanium (Ti), tungsten (W), copper (Cu), silver (Ag), etc. In some embodiments, the conductive coating 120 can include a layer of Au of thickness between 3 micro-inches and 6 micro-inches, a layer of Ni of thickness between 40 micro-inches and 80 micro-inches, another layer of Au of thickness between 75 micro-inches and 125 micro-inches, and a layer of titanium-tungsten alloy (TiW) of thickness between 200 angstrom and 400 angstrom. The Ni layer can provide a solderable trace or surface, which can improve the surface mount solder bonding of the crossover device to the printed circuit board.

The first crossover contact 136 and the second crossover contact 138 are physically isolated from the conductive coating 120 by a first crossover isolation region 132 and a second crossover isolation region 134, respectively. The first and second crossover isolation regions 132 and 134 can be exposed portions of the second surface 104 of the insulating substrate 150 that are not covered by a conductive coating.

Figure 2:
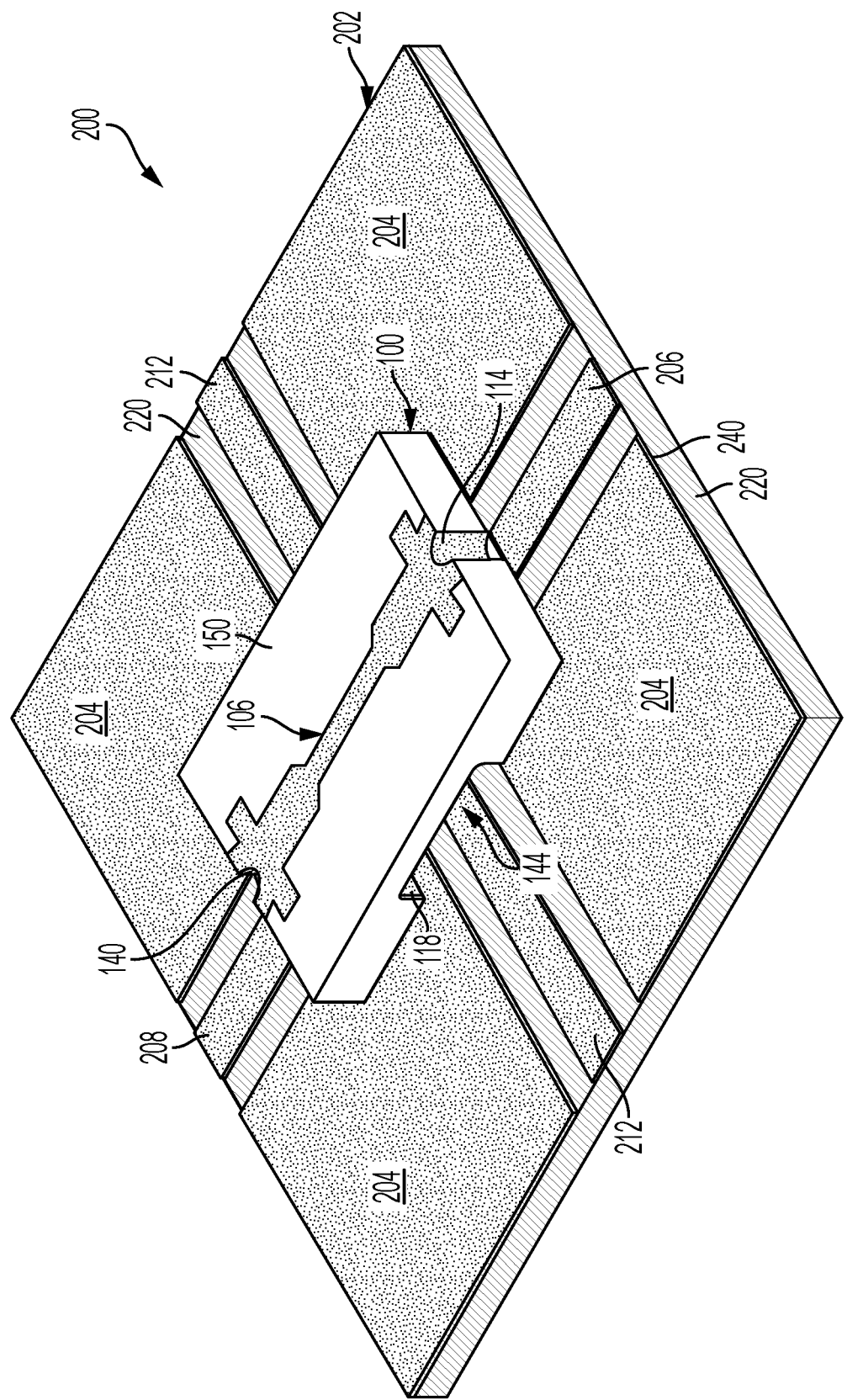
FIG. 2 shows an arrangement including an example RF crossover device positioned over a printed circuit board (PCB).

FIG. 2 shows an arrangement 200 including an example crossover device (e.g., that is shown in FIGS. 1A and 1B) positioned over a printed circuit board (PCB) 202. The PCB 202 includes an insulating board 220 (also referred to as "circuit board") over which at least one metal layer 240 is disposed. The metal layer can be patterned to form a ground plane (or "ground conductor") 204, a first portion 206 of a crossing over RF transmission line (also referred to as "a second RF conductor"), a second portion 208 of the crossing over RF transmission line, and a crossed over RF transmission line (also referred to as "a first RF conductor") 212. The paths of the crossing over RF transmission line and the crossed over RF transmission line 212 can cross over or intersect by virtue of their different respective directions and/or pathways enabled by the crossover device 100. The crossover device 100, discussed above in relation to FIGS. 1A and 1B can be positioned over the PCB 202 such that the second surface 104 faces the PCB 202. In particular, the conductive coating 120 makes contact with the ground plane 204 on the PCB 202. Further, the depression 144 is positioned such that the crossed over RF transmission line 212 passes under the depression 144 without making contact with any conductive surface of on the crossover device 100. For example, the crossed over RF transmission line 212 is separated (e.g., insulated or isolated) from the conductive coating on the depression sidewalls of the crossover device 100. Further, the first transition conductor 114 is aligned with the first portion 206 (e.g., contact point) of the crossing over RF transmission line, and the second transition conductor 140 is aligned with the second portion 208 (e.g., contact point) of the crossing over RF transmission line. The arrangement 200 allows for the crossing over RF transmission line to cross over the crossed over RF transmission line 212 by incorporating the crossover device 100.

Figure 3:
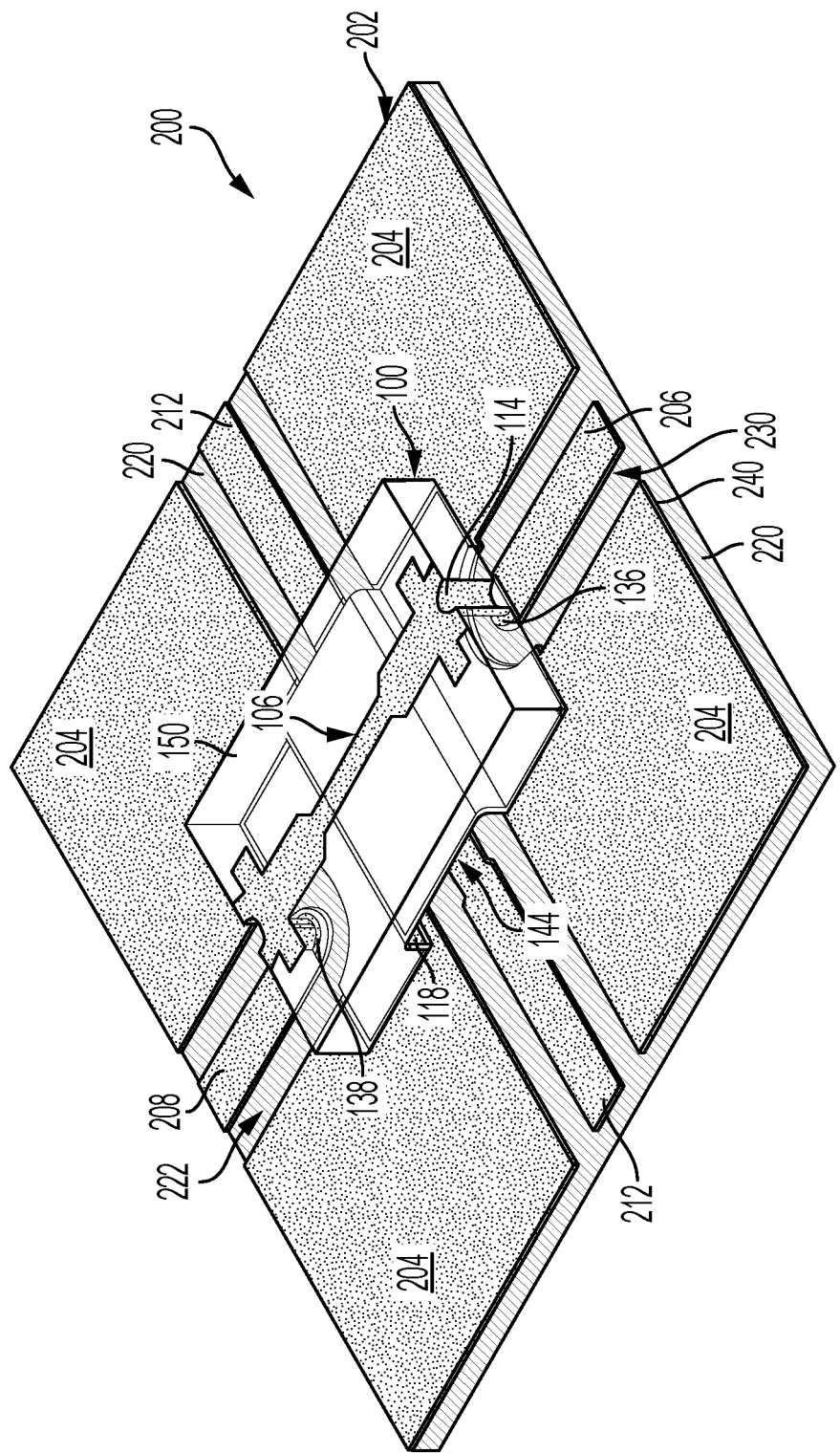
FIG. 3 shows the arrangement shown in FIG. 2 including a transparent view of the insulating substrate.

FIG. 3 shows the arrangement 200 shown in FIG. 2 including a transparent view of the insulating substrate 150. FIG. 3 shows the first crossover contact 136 in contact with the first portion 206 of the crossing over RF transmission line and the second crossover contact 138 in contact with the second portion 208 of the crossing over RF transmission line. Further, the conductive coating 120 on the second surface 104 of the crossover device 100 is in contact with the ground plane 204 on the PCB 202. The PCB 202 includes a first PCB isolation region 230 that isolates or separates the first portion 206 from the ground plane 204, and includes a second PCB isolation region 222 that isolates or separates the second portion 208 from the ground plane 204. The first crossover isolation region 132 on the crossover device 100 coincides with the first PCB isolation region 230, and the second crossover isolation region 134 on the crossover device 100 coincides with the second PCB isolation region 222. Thus, the entire path of the crossing over RF conductor over the crossover device 100 is isolated from the ground plane (or the conductive coating 120) on the crossover device 100 and on the PCB 202.

Figure 4:
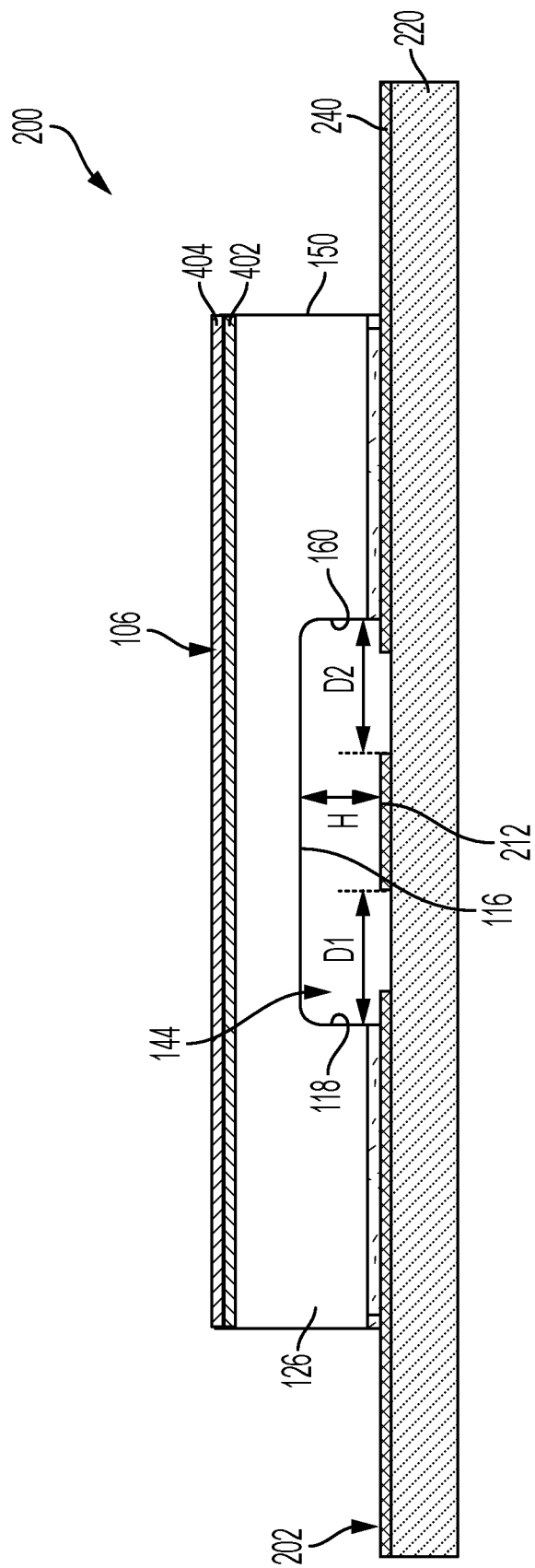
FIG. 4 shows a side view of the arrangement shown in FIG. 2.

FIG. 4 shows a side view of the arrangement 200 shown in FIG. 2. In particular, FIG. 4 shows the side view of the PCB 202 with the crossover device 100 mounted on the PCB 202. The crossed over RF transmission line 212 can be separated from the conductive coating 120 on the first depression sidewall 118 by a distance D1, and from the conductive coating 120 on the second depression sidewall 160 by a distance D2. Further, the crossed over RF transmission line 212 is separated (e.g., isolated or insulated) from the conductive coating 120 on the third surface 116 by a distance H. The larger are the distances D1, D2, and H, the better is the isolation between the crossed over RF transmission line 212 and the crossover conductor 106. In some embodiments, the distances D1 and D2 can have values between 15 mils and 25 mils. In some embodiments, the distance H can have a value between 5 mils and 15 mils.

The crossover conductor 106 can include two or more metal layers. For example, the crossover conductor 106 shown in FIG. 4 has a first metal layer 402 and a second metal layer 404. The first and second metal layers 402 and 404 can include coatings of multiple metals such as gold (Au), nickel (Ni), titanium (Ti), tungsten (W), copper (Cu), silver (Ag), etc. In some embodiments, the first or second metal layers 402 and 404 can include a layer of Au of thickness between 3 micro-inches and 6 micro-inches, a layer of Ni of thickness between 40 micro-inches and 80 micro-inches, a layer of Au of thickness between 75 micro-inches and 125 micro-inches, and/or a layer of titanium-tungsten alloy (TiW) of thickness between 200 angstrom and 400 angstrom.

Referring again to FIGS. 1A and 1B, the crossover conductor 106 can have a width W measured transverse to a length of the crossover conductor 106. In some embodiments, the width W measured right above the depression 144 (or tunnel). For example, the width W of the crossover conductor 106 can be measured transverse to the crossover conductor axis 130 above the depression 144. The width W of the crossover conductor can be selected based at least on the desired impedance value of the crossover conductor 106 and a thickness T2 of the insulating substrate 150 over the depression. In some embodiments, the thickness T2 is measured above the depression 144 (or tunnel). Typically, for a fixed impedance value, the width W can have an inverse relationship with the thickness T2 of the insulating substrate 150. In other words, the width W can be a decreasing function of T2 for a fixed value of impedance, such that when the value of T2 is increased, the value of W decreases for the fixed value of impedance. As an example, Equation (1) below establishes a relationship between the impedance Z of the crossover conductor 106 and parameters such as the width W and the thickness T2. Equations (2)-(7) provide expression for various variables in Equation (1).

$$z = \frac{n}{2\pi\sqrt{\varepsilon_{re}}} \ln\left[\frac{F}{u} + \sqrt{1 + \left(\frac{2}{u}\right)^2}\right] \quad \text{Equation (1)}$$

$$\varepsilon_{re} = \frac{\varepsilon_r + 1}{2} + \frac{\varepsilon_r - 1}{2}\left(1 + \frac{10}{u}\right)^{-ab} \quad \text{Equation (2)}$$

$$u = W/T2 \quad \text{Equation (3)}$$

$$n = 120\pi \quad \text{Equation (4)}$$

$$a = 1 + \frac{1}{49}\ln\left(\frac{u^4 + \left(\frac{u}{52}\right)^2}{u^4 + 0.432}\right) + \frac{1}{18.7}\ln\left[1 + \left(\frac{u}{18.1}\right)^3\right] \quad \text{Equation (5)}$$

$$b = 0.564\left(\frac{\varepsilon_r - 0.9}{\varepsilon_r + 3}\right)^{0.053} \quad \text{Equation (6)}$$

$$F = 6 + (2\pi - 6)\exp\left[-\left(\frac{30.666}{u}\right)^{0.7528}\right] \quad \text{Equation (7)}$$

In the above equations, $\varepsilon_r$ is the dielectric constant of the insulating substrate 150.

Figure 5:
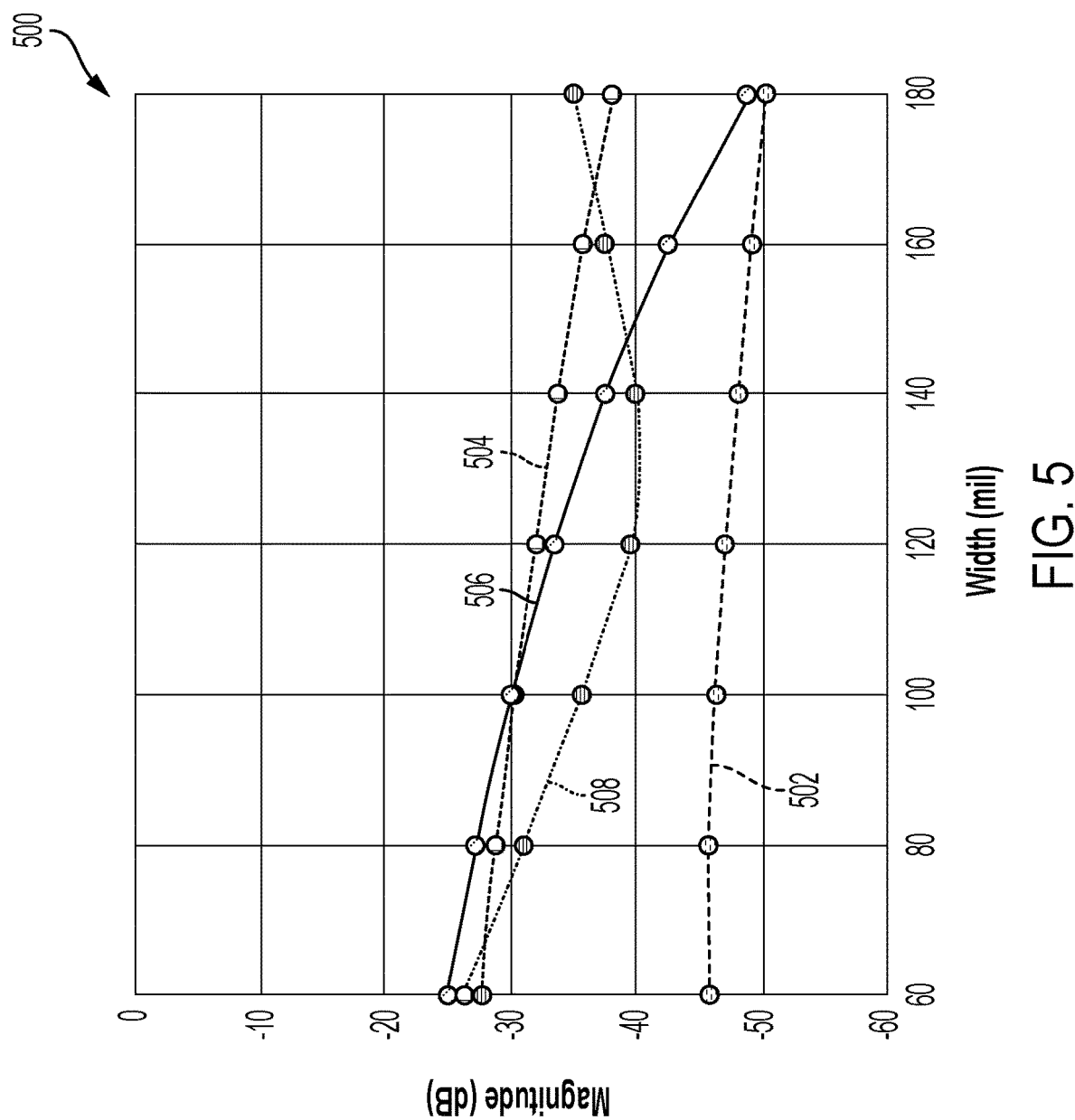
FIG. 5 shows an example graph of a magnitude of minimum isolation between a crossover conductor and a crossed over RF transmission line plotted over various values of a width of the crossover conductor as well as different frequencies.

In some embodiments, the isolation between the crossover conductor 106 and the crossed over RF transmission line (e.g., 212 in FIGS. 2-4) can be a function of the width along a longitudinal axis 128 of the crossover component. In particular, the isolation can be an increasing function of the width of the crossover component. That is, the magnitude of isolation increases with the increase in width of the crossover component. In some instances, this relationship holds for a specific band of frequencies. FIG. 5 shows an example graph 500 of a magnitude of minimum isolation between the crossover conductor 106 and the crossed over RF transmission line 212 plotted over various values of the component width (in mils) of the crossover conductor 106. The first plot 502 represents a frequency of 10 GHz, the second plot 504 represents a frequency of 20 GHz, the third plot 506 represents a frequency of 30 GHz, and the fourth plot 508 represents a frequency of 40 GHz. At least for frequencies up to 30 GHz, the magnitude of minimum isolation between the crossover conductor 106 and the crossed over RF transmission line 212 increases with an increase in the width W of the crossover conductor 106.

While FIGS. 1A-4 show only a single crossover conductor 106 disposed over the first surface 102 of the insulating substrate 150, in some embodiments, two or more crossover conductors can be disposed over the first surface to provide crossover capability to more than one RF transmission line. For example, additional crossover conductors 106 can be positioned adjacent to each other over the first surface 102 of the insulating substrate 150 to allow two crossing over RF transmission lines to cross over one or more crossed over RF transmission lines. The crossover conductors can extend between the first edge 108 and the second edge 142 of the first surface 102 of the insulating substrate 150. The crossover device 100 can then include a corresponding numbers of transition conductors (e.g., 114 and 140), crossover contacts (e.g., 136 and 138) to connect to the portions of the corresponding crossing over RF transmission lines. Furthermore, the size or width of the depression 144 can be adjusted according to the number of crossed over conductors over which the crossover device 100 is placed, such that the distance D1 and D2 is maintained between the conductive coating 120 on the first and second depression sidewalls 118 and 160 and the nearest crossed over RF transmission line.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A radio frequency (RF) crossover device, comprising:
    an insulating substrate having a first surface and a second surface opposing the first surface;
    a crossover conductor disposed on the first surface;
    a depression in the second surface extending between two side surfaces of the insulating substrate and defined at least in part by (i) a third surface recessed in relation to the second surface, and (ii) at least one sidewall that extends between the second surface and the third surface, wherein the crossover conductor includes: (a) a transmission line having an impedance based on a width of the transmission line and a thickness of the insulating substrate defined between the first surface and the third surface, and (b) an impedance matching structure disposed on the first surface above at least a portion of the second surface; and
    a conductive coating formed over at least a portion of the second surface, the third surface, and the at least one sidewall, the conductive coating being electrically isolated from the crossover conductor by the insulating substrate.

2. The RF crossover device of claim 1, further comprising:
    a first transition conductor electrically connected to the crossover conductor on a first side of the depression and extending between the first and second surfaces of the insulating substrate; and
    a second transition conductor electrically connected to the crossover conductor on a second side of the depression, opposite the first side of the depression, and extending between the first and second surfaces of the insulating substrate.

3. The RF crossover device of claim 2, wherein the first transition conductor extends along a first side end of the insulating substrate between the first surface and the second surface, and wherein the second transition conductor extends along a second end surface of the insulating substrate between the first surface and the second surface.

4. The RF crossover device of claim 3, wherein the first end surface of the insulating substrate includes a first indented region, and wherein the first transition conductor is at least partially disposed over the first indented region.

5. The RF crossover device of claim 2, further comprising:
    a first crossover contact disposed on the second surface of the insulating substrate and electrically connected to the first transition conductor; and
    a second crossover contact disposed on the second surface of the insulating substrate and electrically connected to the second transition conductor.

6. The RF crossover device of claim 5, wherein the first crossover contact is separated from the conductive coating on the second surface by a first crossover isolation region, and wherein the second crossover contact is separated from the conductive coating on the second surface by a second crossover isolation region.

7. The RF crossover device of claim 1, wherein the crossover conductor includes a plurality of metal layers, wherein materials of at least two metallic layers of the plurality of metallic layers are different.

8. The RF crossover device of claim 7, wherein the plurality of metallic layers include metallic layers of at least two of copper, silver, gold, nickel, or titanium-tungsten alloy.

9. The RF crossover device of claim 1, wherein the conductive coating includes a plurality of metallic layers, wherein materials of at least two metallic layers of the plurality of metallic layers are different.

10. The RF crossover device of claim 9, wherein the plurality of metallic layers include metallic layers of at least two of copper, silver, gold, nickel, or titanium-tungsten alloy.

11. The RF crossover device of claim 1, wherein the depression extends in a direction that is non-parallel to a direction in which the crossover conductor extends on the first surface.

12. The RF crossover device of claim 1, wherein the impedance of the transmission line is based on a ratio of the width of the transmission line and the thickness of the insulating substrate.

13. The RF crossover device of claim 1, wherein the insulating substrate includes at least one of a ceramic material, glass, sapphire, quartz or a printed circuit board material.

14. The RF crossover device of claim 1, wherein the impedance matching structure is positioned between the transmission line and at least one of a first edge and a second edge of the first surface.

15. A radio-frequency (RF) device comprising:
 a circuit board having a first surface and an opposing second surface;
 a first RF conductor disposed on the first surface of the circuit board, the first RF conductor extending in a first direction;
 a second RF conductor disposed on the first surface of the circuit board, the second RF conductor extending in a second direction, different from the first direction;
 a ground conductor disposed on the first surface of the circuit board, the ground conductor electrically isolated from the first RF conductor and the second RF conductor;
 a RF crossover device positioned on the circuit board and including:
  an insulating substrate having a first surface and a second surface opposing the first surface;
  a crossover conductor disposed on the first surface;
  a depression in the second surface extending between two side surfaces of the insulating substrate and defined at least in part by (i) a third surface recessed in relation to the second surface, and (ii) at least one sidewall that extends between the second surface and the third surface, wherein the crossover conductor includes: (a) a transmission line having an impedance based on a width of the transmission line and a thickness of the insulating substrate defined between the first surface and the third surface, and (b) an impedance matching structure disposed on the first surface above at least a portion of the second surface; and
  a conductive coating formed over at least a portion of the second surface, the third surface, and the at least one sidewall, the conductive coating being insulated from the crossover conductor by the insulating substrate,
 wherein the conductive coating over the second surface of the insulating substrate makes contact with the ground plane,
 wherein the first RF conductor passes under the depression in the second surface of the insulating substrate, and
 wherein the second RF conductor is electrically connected to the crossover conductor disposed on the first surface of the insulating substrate.

16. The RF device of claim 15, wherein the conductive coating on the at least one sidewall is separated from the first RF conductor by a distance of between 15 mils and 25 mils.

17. The RF device of claim 15, wherein the conductive coating on the third surface of the insulating substrate is separated from the first RF conductor disposed on the first surface of the circuit board by a distance of between 5 mils and 15 mils.

18. The RF device of claim 15, wherein a magnitude of isolation between the first RF conductor and the crossover conductor is an increasing function of a width of the crossover conductor measured over the depression.

19. The RF device of claim 15, wherein the crossover conductor is a first crossover conductor, the RF device further comprising:
 a second crossover conductor disposed adjacent to the first crossover conductor over the first surface of the insulating substrate.

* * * * *